(12) United States Patent
Nagata et al.

(10) Patent No.: US 7,039,536 B2
(45) Date of Patent: May 2, 2006

(54) METHOD AND APPARATUS FOR ANALYZING A SOURCE CURRENT WAVEFORM IN A SEMICONDUCTOR INTEGRATED CIRCUIT

(75) Inventors: Makoto Nagata, Hiroshima (JP); Atsushi Iwata, Hiroshima (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 45 days.

(21) Appl. No.: 09/977,994

(22) Filed: Oct. 17, 2001

(65) Prior Publication Data

US 2002/0147555 A1 Oct. 10, 2002

(30) Foreign Application Priority Data

Feb. 2, 2001 (JP) .............................. 2001-026795

(51) Int. Cl.
*G06F 17/00* (2006.01)
(52) U.S. Cl. .............................. 702/70; 64/66; 64/190; 716/4; 703/14
(58) Field of Classification Search ............ 702/66–70, 702/189, 190, 191, 195, 64, 127, 182; 716/1, 716/4, 5, 8–11; 703/14–16
See application file for complete search history.

(56) References Cited

U.S. PATENT DOCUMENTS

| 4,366,456 A | * | 12/1982 | Ueno et al. ................. 333/173 |
| 4,543,546 A | * | 9/1985 | Hariharan .................... 333/173 |
| 5,300,798 A | * | 4/1994 | Yamazaki et al. ........... 257/207 |
| 5,424,670 A | * | 6/1995 | Samuels et al. ............. 327/337 |
| 5,481,484 A | * | 1/1996 | Ogawa et al. ................ 703/14 |
| 6,066,177 A | | 5/2000 | Hatsuda ........................ 703/19 |
| 6,144,217 A | * | 11/2000 | Iwata et al. .................... 326/27 |
| 6,397,172 B1 | * | 5/2002 | Gurney ......................... 703/14 |
| 6,480,986 B1 | * | 11/2002 | Richer ............................ 716/4 |
| 6,564,355 B1 | * | 5/2003 | Smith et al. .................... 716/4 |

(Continued)

FOREIGN PATENT DOCUMENTS

JP 04-6850 1/1992

(Continued)

OTHER PUBLICATIONS

Nagata et al., "Measurements and Analyses of Substrate Noise Waveform in Mixed Signal IC Environment". Proceedings of the IEEE 1999 Custom Integrated Circuits Conference. May 1999.*

(Continued)

*Primary Examiner*—Marc S. Hoff
*Assistant Examiner*—Jeffrey R. West
(74) *Attorney, Agent, or Firm*—McDermott Will & Emery LLP

(57) ABSTRACT

The invention provides a method of analyzing a source current at a higher speed and an enhanced accuracy in a semiconductor integrated circuit including a digital circuit. The method to analyze a waveform of the source current, with consideration of re-distribution of charges throughout the digital circuit in the semiconductor integrated circuit, expressing the digital circuit with series of parasitic capacitors $\Sigma C_{ch,\uparrow}(nT)$ and $\Sigma C_{ch,\downarrow}(nT)$ to be charged and connected between the source and the ground lines. The capacitor series are calculated in time series based on the distribution of switching operations of the logic gates included in the digital circuit. An analysis model for determining the waveform of the source current in the digital circuit is obtained by connecting the parasitic capacitor series with a couple of respective parasitic impedances $Z_d$ and $Z_g$ of the source line and the ground line.

14 Claims, 7 Drawing Sheets

U.S. PATENT DOCUMENTS

| | | | | |
|---|---|---|---|---|
| 6,618,837 | B1* | 9/2003 | Zhang et al. | 716/4 |
| 6,732,065 | B1* | 5/2004 | Muddu | 703/2 |
| 2002/0022951 | A1* | 2/2002 | Heijningen et al. | 703/16 |
| 2003/0125919 | A1* | 7/2003 | Chikamichi | 703/14 |

FOREIGN PATENT DOCUMENTS

JP          10-124563          5/1998

OTHER PUBLICATIONS

Su et al., "Experimental Results and Modeling Techniques for Substrate Noise in Mixed-Signal Integrated Circuits". IEEE Journal of Solid-State Circuits. vol. 28. No. 4, Apr. 1993.*

Nagata et al., "Physical Design Guides for Substrate Noise Reduction in CMOS Digital Circuits", Presented May 21, 2000-May 24, 2000, Published IEEE Journal of Solid-State Circuits, Mar. 2001. vol. 36, Issue 3, pp. 539-549.*

U.S. Appl. No. 60/190,704.*

Mitra et al., "A Methodology for Rapid Estimation of Substrate-Coupled Switching Noise", IEEE 1995 Custom Integrated Circuits Conference.*

Charbon et al., "Modeling Digital Substrate Noise Injection in Mixed-Signal IC's", IEEE Transactions on Computer-Aided Design of Integrated Circuits and Systems, vol. 18, No. 3, Mar. 1999.*

Kenji Shimazaki, Hiroyuki Tsujikawa, Seijiro Kojima, and Shouzuo Hirano, "Lemings: LSI's EMI-Noise Analysis With Gate Level Simulator," The Proceedings of IEEE, ISQED2000, pp. 1-8.

M. Nagata, et al, "*Measurements and Analyses of Substrate Noise Waveform in Mixed-Signal IC Environment*" IEEE Transactions on Computer-Aided Design of Integrated Circuits and Systems, vol. 19, No. 6, Jun. 2000, pp. 671-678.

M. Nagata, et al, *Measurements and Analyses of Substrate Noise Waveform in Mixed-Signal IC Environment* Proceedings of the IEEE 1999 Custom Integrated Conference, May 1999, pp. 575-578.

M. Nagata, et al, "Substrate Crosstalk Analysis in Mixed Signal CMOS Integrated Circuits" Asia and South Pacific Design Automation Conference 2000 With EDA Technofair 2000. Jan. 2000, pp. 623-629.

M. Nagata, et al, "*Physical Design Guides for Substrate Noise Reduction in CMOS Digital Circuits*" Proceedings of the IEEE 2000 Custom Integrated Circuits Conference, May 2000, vol. 36, No. 3, pp. 539-549.

Nagata, M., et al., "Physical Design Guides for Substrate Noise Reduction in CMOS Digital Circuits," IEEE Journal of Solid-State Circuits, vol. 36, No. 3, (Mar. 2001).

Nagata, M., et al, "Quantitative Characterization of Substrate Noise for Physical Design Guides in Digital Circuits," IEEE 2000 Custom Integrated Circuits Conference, Orlando, Florida, May 21-24, 2000.

Table of Contents for the Proceedings of the IEEE 2000 Custom Integrated Circuits Conference, Orlando, Florida, May 21-24, 2000.

\* cited by examiner

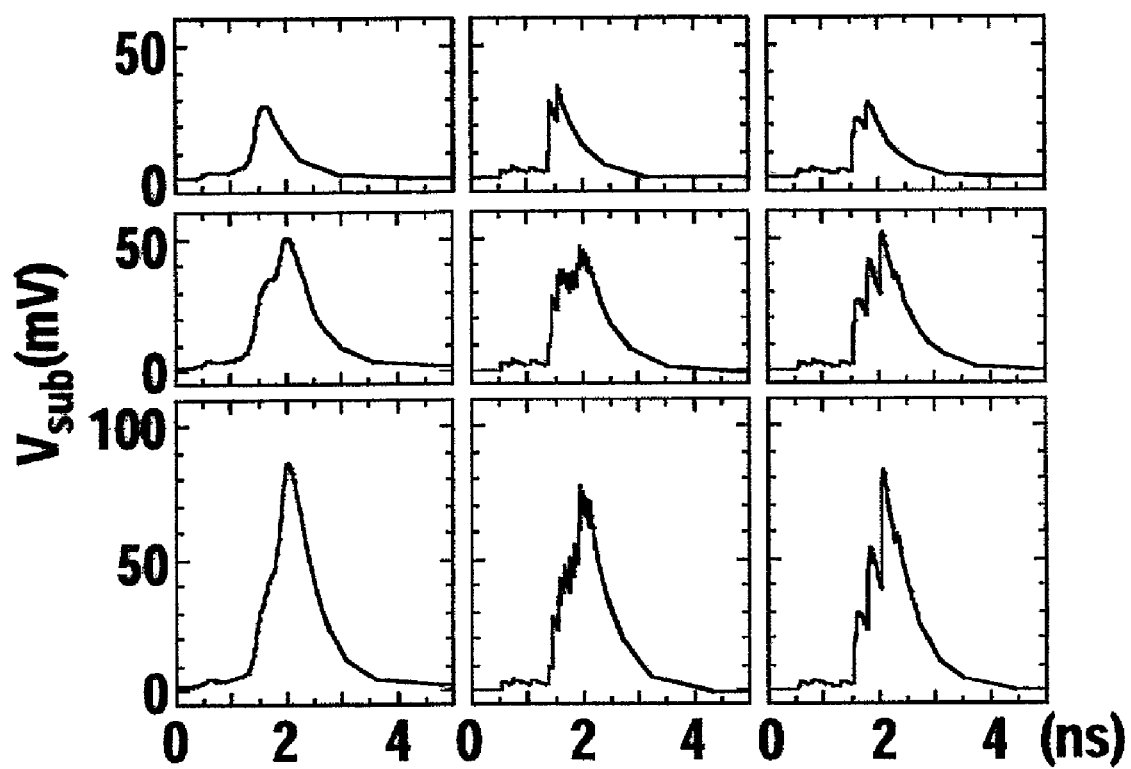

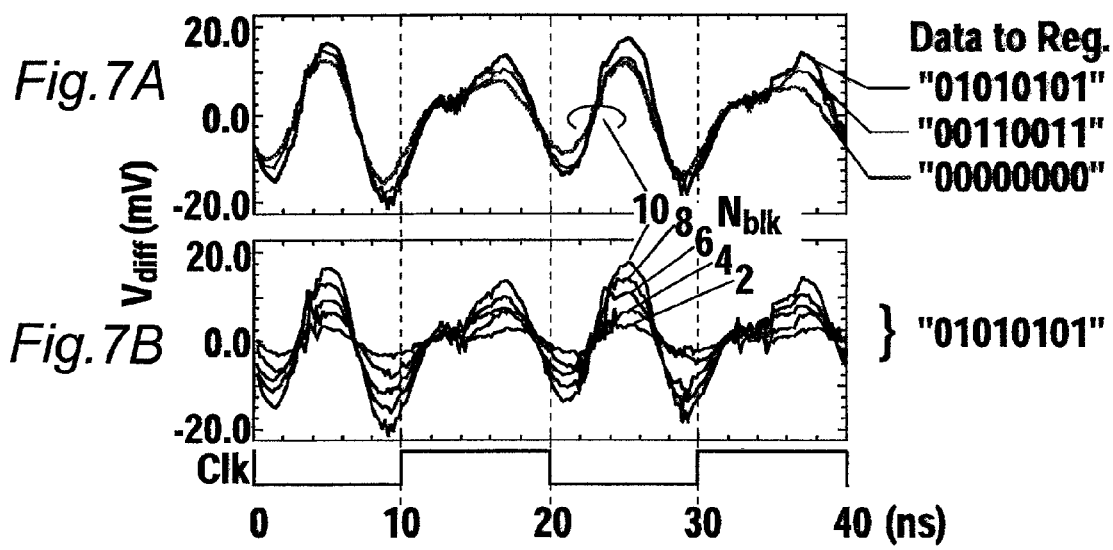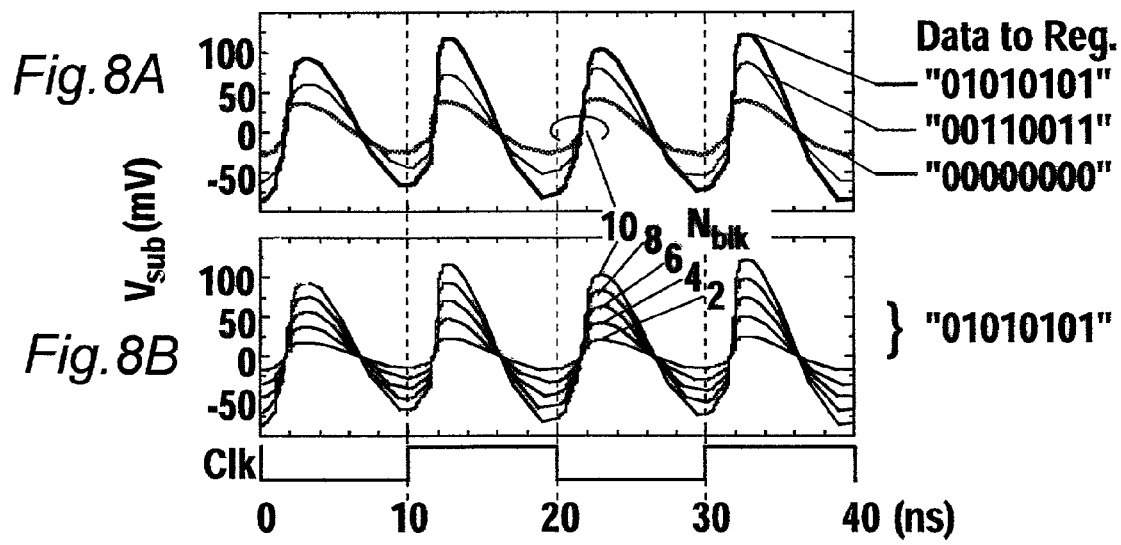

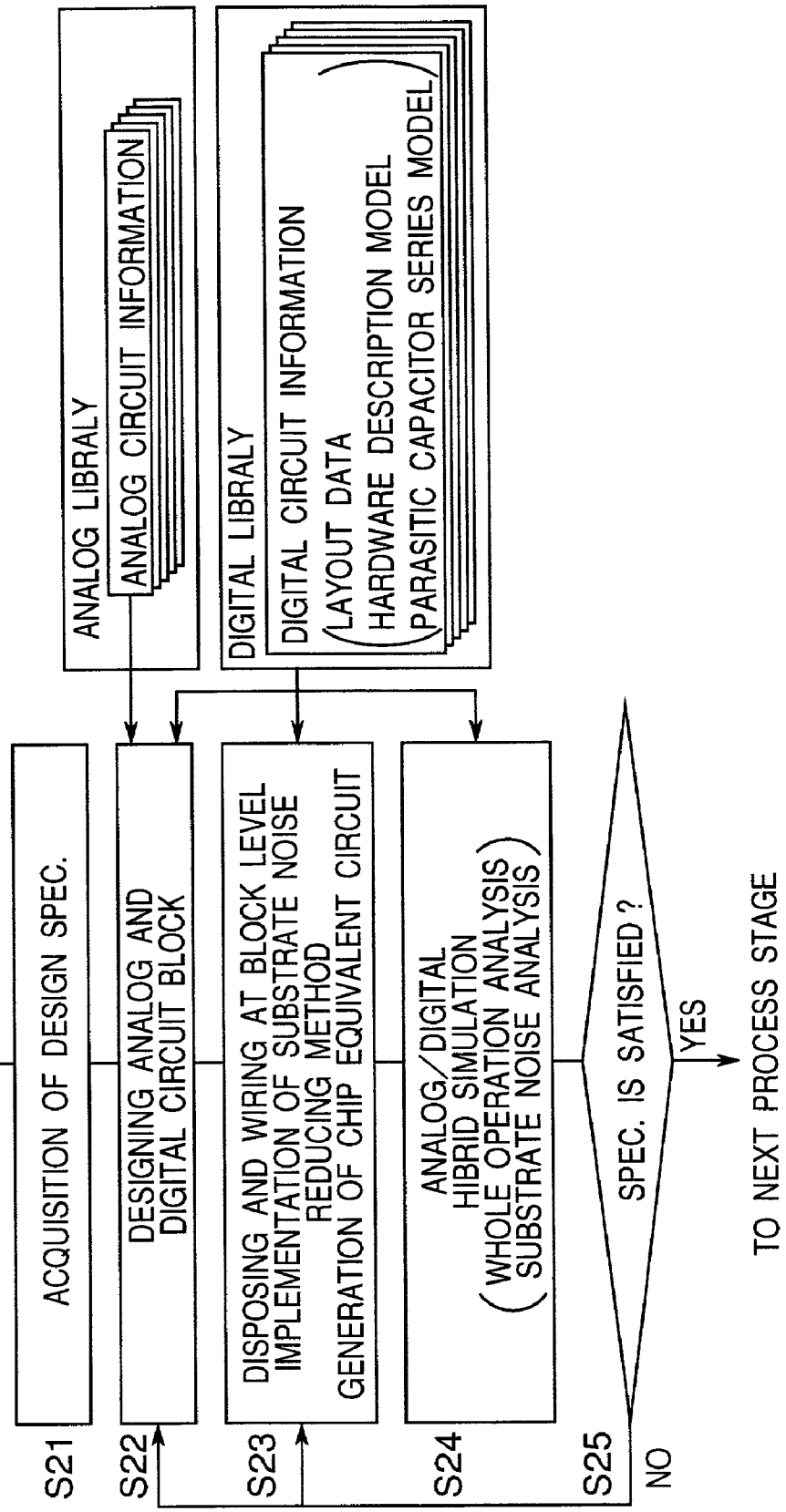

METHOD AND APPARATUS FOR ANALYZING A SOURCE CURRENT WAVEFORM IN A SEMICONDUCTOR INTEGRATED CIRCUIT

BACKGROUND OF THE INVENTION

1. Field of the Invention

The present invention relates to a technology for designing a large-scale semiconductor integrated circuit, or particularly to a method of analyzing a source current across a logic circuit in a large-scale semiconductor integrated circuit and a technology for circuit designing with the method.

2. Description of the Related Art

As electronic devices in a large-scale integrated circuit (referred to as "LSI", hereinafter) have been reduced in the size, digital circuits patterned in the LSI are scaled out and improved in an operation speed. However, such LSIs and their application systems generally suffer from degradation in the performance due to the generation of noises which results from a change in the source current flowing across the LSI circuits during the operation.

FIG. 10 illustrates a mixed analog/digital integrated circuit (referred to as AD mixed LSI hereinafter). As shown, a single semiconductor chip mounts an analog-to-digital converter (ADC) for converting analog signals received from an outside to a digital signal at high accuracy, analog circuits including a clock generator circuit (PLL) for supplying a high-speed clock signal to built-in digital circuits, and the digital circuits including a microprocessor (CPU), and a digital signal processor (DSP) for processing the input signals.

In such an AD hybrid LSI chip, substrate noises generated from the digital circuits may leak and dissipate via the silicon substrate, the LSI chip package, or the wirings on a printed circuit board (PCB) to the analog circuits of which operations are thus disturbed. More particularly, the ADC may be declined in the accuracy of conversion, the PLL may be increased in the fracture of clock frequency, and the performance of the chip itself may thus be degraded or operate in error.

The principal cause of substrate noise generation is a change in voltage generated when the source current of the digital circuits flowing through internal power-supply and ground wirings, which connect the external power supply to the LSI chip, interacts with the parasitic impedances parasitic on those wirings on the basis of physical laws such as Ri and Ldi/dt.

Electromagnetic noises emitted from the LSI may also interfere and decline the operation of the peripheral electronic circuits. The electromagnetic noises is caused by the electromagnetic interaction which reflects a change in the source current of the digital circuits.

As clearly understood, the generation of noises largely depends on a change in the source current. It is hence desired to provide an analysis method for estimating waveform of the source current in each large-scale digital circuit block at high speed and high accuracy, by which VLSI designers can apply effectively measures to avoid.

A couple of conventional methods of analyzing the waveform of a source current are referenced. A first method includes expanding the digital circuits to a transistor level and using a circuit simulator for transition analysis thus to examine the waveform of the source current. A second method includes approximating the waveform of a consumed current at each logic gate in the digital circuits to a triangle wave. The triangle wave represents that the charging and discharging processes of load impedance in the switching operation of the logic gate complete within switching time. Then, the waveforms of the currents of the digital circuits are summed to have a waveform of the source current (K. Shimazaki, H. Tsujikawa, S. Kojima, and S. Hirano, "LEMINGS: LSI's EMI-Noise Analysis with Gate Level Simulator", the proceedings of IEEE, ISQED2000).

The two conventional methods have the following drawbacks. The first method provides a higher level of the analysis accuracy but increases the execution time required for the circuit simulation on a large-scale digital circuit and will hence be unsuited for particular applications, such as design optimization of the source/grounding system for minimizing the generation of noises, where the simulation has to be repeated at each requirement of the design. High-speed simulation is expected by the use of logic simulators in the second method. However, in practice, the digital circuit permits the charging and discharging electricity to be moved at a high speed due to the re-distribution of charges among the parasitic capacitor at the initial state of the switching operation. This is followed by the external source supplying a charge which has a time constant a few times greater than the switching period. The second method fails to include those steps. Accordingly, the waveform of the source current will hardly be reproduced at high accuracy. The second method will be unsuited for analyzing noises sensitive to a change with time in the source current.

SUMMARY OF THE INVENTION

The present invention has been developed for solving the foregoing drawbacks and its object is to provide a method and an apparatus for analyzing the waveform of a source current at an enhanced accuracy and a higher speed with consideration of re-distribution of charges throughout the digital circuit. It is another object of the present invention to provide a method of analyzing substrate noises and a method of designing LSI with low noise which both employ the above method of analyzing the waveform of a source current at an enhanced accuracy and a higher speed.

In a first aspect of the invention, a method of analyzing a waveform of a source current in a semiconductor integrated circuit including a digital circuit having a plurality of logic gates is provided. The method comprises: expressing the digital circuit, according to a distribution of switching operations of the logic gates in the digital circuit, as a parasitic capacitor series which is a time series of parasitic capacitors each connected between a source line and a ground line to be charged, and a group of parasitic capacitors each charged statically; generating an analysis model by coupling one end of the parasitic capacitor series, one end of the group of parasitic capacitors charged statically, and parasitic impedance of the source line, and connecting the other end of the parasitic capacitor series, the other end of the group of parasitic capacitors charged statically, and parasitic impedance of the ground line; and determining the waveform of the source current in the digital circuit from the analysis model. Thus the analysis of the source current waveform including a re-distribution of charges throughout the digital circuit can be simulated at a higher speed and an enhanced accuracy.

In the method, the digital circuit may be divided into a plurality of segments along the border at which the parasitic impedances of the source line and the ground line are locally increased. Then the parasitic capacitor series and the group of the parasitic capacitors statically charged may be assigned for a group of the logic gates included in each segment. Thus the accuracy of the analysis can be improved.

The capacitance of each parasitic capacitor included in the parasitic capacitor series may be determined every predetermined time interval. Then the length of the time interval may be set according to a frequency of the switching operations of the logic gates in the time interval.

The length of the time interval may be set to be of shorter as the frequency of the switching operations is greater. Thus the analysis operation can be speeded up and its result can further be improved in the accuracy.

Capacitance of the parasitic capacitor to be charged may be calculated from input and output capacitance of the logic gates in the digital circuit to be analyzed.

The method may comprise determining a change in voltage which is caused by an interaction between the source current in the digital circuit determined from the analysis model and the parasitic impedances of the source line and the ground line, and treating the determined change in voltage as the substrate noise of the semiconductor integrated circuit to analyze the substrate noise. Thus the substrate noise can be simulated at high accuracy and a high speed.

In a second aspect of the invention, a method of analyzing a substrate noise is provided which comprises regarding, as a substrate noise, a change in voltage which is caused by an interaction between the source current in the digital circuit determined from the analysis model and the parasitic impedances of the source line and the ground line, and using the above method of analyzing a waveform of a source current with the regarded change in voltage to analyze the substrate noise.

In a third aspect of the invention, a method of designing a semiconductor integrated circuit which includes analog and digital circuits is provided. The method comprises: receiving the design specification; designing the analog and digital circuits according to the design specification; analyzing a substrate noise generated in the digital circuits using the above method of analyzing a substrate noise; and re-designing the analog and digital circuits or their layout and the location of guard bands by reviewing the result of the substrate noise analysis so that the design specification is satisfied. Hence implementing a more preferable condition of the low noise design.

In a fourth aspect of the invention, an apparatus is provided which analyzes a waveform of a source current in a semiconductor integrated circuit including a digital circuit having a plurality of logic gates. The apparatus comprises: arrangement for expressing the digital circuit, according to a distribution of switching operations of the logic gates in the digital circuit, as a parasitic capacitor series which is a time series of parasitic capacitors each connected between a source line and a ground line to be charged, and a group of parasitic capacitors each charged statically; arrangement for generating an analysis model by coupling one end of the parasitic capacitor series, one end of the group of parasitic capacitors charged statically, and parasitic impedance of the source line, and connecting the other end of the parasitic capacitor series, the other end of the group of parasitic capacitors charged statically, and parasitic impedance of the ground line; and arrangement for determining the waveform of the source current in the digital circuit from the analysis model. Thus the analysis of the source current waveform including a re-distribution of charges throughout the digital circuit can be simulated at a higher speed and an enhanced accuracy.

BRIEF DESCRIPTION OF THE DRAWINGS

A better understanding of the invention will be obtained by reading the description of the invention below, with reference to the following drawings, in which:

FIG. 6A is a diagram showing a waveform of the substrate noise in a shift register measured using a conventional method (full transistor description) (where the parasitic impedances of the source and ground lines include serial resistance component);

FIGS. 6B and 6C are diagrams showing waveforms of the substrate noise in a shift register measured, in a first application, using the source current analyzing method of the present invention (where the parasitic impedances of the source and ground lines include serial resistance component);

FIGS. 7A and 7B are diagrams illustrating actually measured waveforms of the substrate noise in a first application;

FIGS. 8A and 8B are diagrams showing waveforms of the substrate noise in a shift register measured, in a first application, using the source current analyzing method of the present invention (where the parasitic impedances of the source and ground lines include serial inductance component);

FIG. 9 is a flowchart for optimizing the substrate noise tolerant design of AD hybrid LSI with the use of the substrate noise analysis of the source current analyzing method of the present invention.

DETAILED DESCRIPTION OF THE INVENTION

A method and an apparatus for analyzing the waveform of a source current will be described in the form of embodiments of the present invention will be described referring to the accompanying drawings.

<Concept of Source Current Analysis Model>

The description starts with the concept of a source current analysis model using the method of analyzing the waveform of a source current according to the present invention.

The method of analyzing the waveform of a source current according to the present invention is based on the fact that the source current in a large-scale digital circuit depends significantly on a process of charging the load capacitance at the switching operation of each logic gate provided in the digital circuit. The method includes translating the large-scale digital circuit into a series of parasitic capacitors connected in time series between the power source and the ground according to a distribution of the switching operations of internal logic gates, and determining the waveform of a source current from a current for charging and discharging the parasitic capacitors. A process of discharging the load capacitance at the switching operation of each logic gate is equal to a process of erasing the charge of the load capacitance stored by the preceding charging process with the use of a short-circuit current applied locally to the logic gate. Accordingly, the contribution of the discharging to the source current will approximately be negligible.

Figure 1:
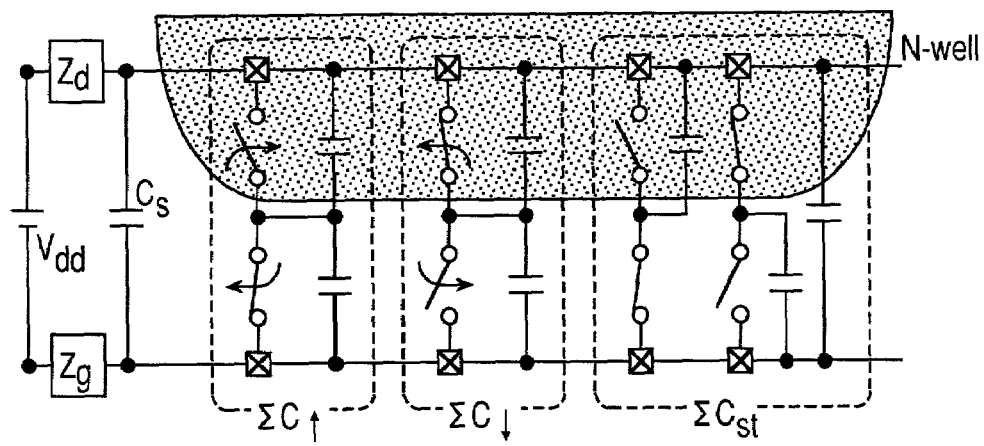
FIG. 1 is a diagram illustrating a source current waveform analyzing model used in a method of analyzing the source current according to the present invention.

More specifically, as shown in FIG. 1, the large-scale digital circuit is regarded as a group of load parasitic capacitors where connection of lines to both the source and the ground is switched by the logic state. Assuming that all of logical functions are ignored and the switching operation of logic gates only is involved, the large-scale digital circuit is then illustrated as an equivalent circuit which includes a group of capacitors ($\Sigma C_\uparrow$) parasitic to the logic gates arranged to perform a rise transition within a given length of time, a group of capacitors ($\Sigma C_\downarrow$) parasitic to the logic gates arranged to perform a fall transition within the given length of time, and a group of capacitors ($\Sigma C_{st}$) parasitic to the logic gates arranged to remain unchanged in the given length of time. The equivalent circuit shown in FIG. 1 has each parasitic capacitor accompanied with a switching element for connecting/disconnecting one end of the capacitor to/from the source or ground. The switching operation of each logic gate is expressed by the switching operation of the switching element for switching the connection of the parasitic capacitor between the source and the ground.

In FIG. 1, a parasitic capacitor $C_s$ is a capacitor developed statically in a block, such as a de-coupling capacitor or a well capacitor in a CMOS device, and impedances $Z_d$ and $Z_g$ are parasitic impedances developed in the source line and the ground line, respectively. It is also noted that the rise transition means an operation in which an output of the logic gate shifts from a low level (equal to the potential of the ground line) to a high level (equal to the potential of the source line). The fall transition means an operation in which an output of the logic gate shifts from the high level to the low level.

As the groups of capacitors are distributed at higher density throughout the digital circuits in a semiconductor chip, other impedances parasitic on local wirings connecting the capacitors within the logic circuit may be as small as negligible. This allows the charges to be transferred at high speeds between the parasitic capacitors $C_\uparrow$ and $C_\downarrow$ at the active logic gates and the static capacitors $C_{st}$ and $C_s$, thus accelerating the switching operation of the logic gates. The static capacitors $C_{st}$ and $C_s$ function as charge reservoirs during the charge re-distribution process. The charges to be charged are supplied from an external source. As the charges flow through the parasitic impedances $Z_d$ and $Z_g$, they produce a source current having a time constant $\tau$, as shown below. Accordingly, the substrate noise varies at a speed several times slower than that of the switching operation.

$$\tau = (Z_d + Z_g) \cdot (\Sigma C_\uparrow + \Sigma C_\downarrow + \Sigma C_{st} + C_s) \quad (1)$$

(Time Division of Parasitic Capacitor Series)

Figure 2A:
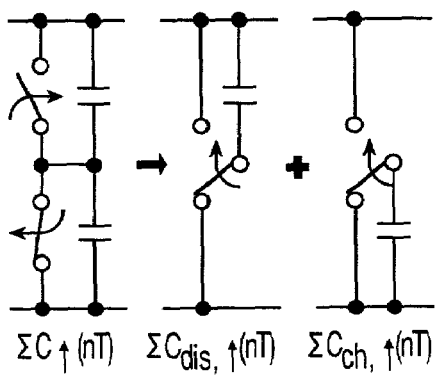
FIG. 2A is a diagram illustrating parasitic capacitors in a rise transition state separated into a charged capacitor and a discharged capacitor.
Figure 2B:
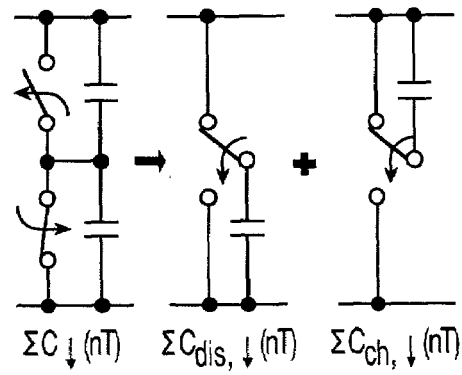
FIG. 2B is a diagram illustrating parasitic capacitors in a fall transition state separated into a charged capacitor and a discharged capacitor.
Figure 2C:
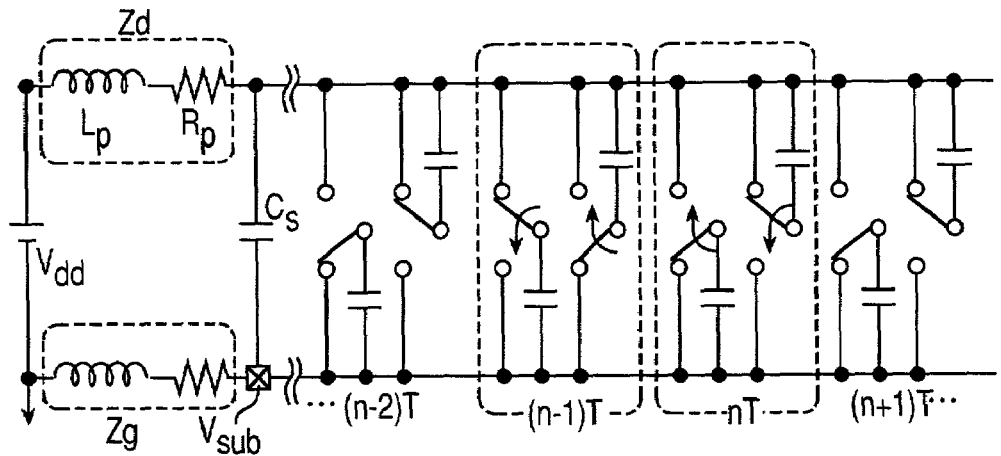
FIG. 2C is a diagram illustrating an array of time division parasitic capacitors.

For calculating a change with time of the source current during the digital circuit operation, each capacitor in the series of parasitic capacitors is time-divided to be expressed in time series. As shown in FIGS. 2A to 2C, the equivalent circuit is controlled with a period T and a number n indicative of an interval divided in the time (referred to as "a time interval" hereinafter). The group of parasitic capacitors $\Sigma C_\uparrow$ (nT) at the logic gates arranged to perform the rise transition and the group of parasitic capacitors $\Sigma C_\downarrow$ (nT) at the logic gates arranged to perform the fall transition, are classified to the group of capacitors $\Sigma C_{dis}$(nT) to be discharged, and the group of capacitors $\Sigma C_{ch}$(nT) to be charged, respectively, and then summed in each of the discharged and charged capacitors group. It should be noted that in FIG. 2, "$C_{xx}$(nT)" represents a capacitor $C_{xx}$ in the nth time interval.

As shown in FIG. 2A, the group of parasitic capacitors $\Sigma C_\uparrow$ (nT) at the switching operation for rise in the nth time interval is classified into the group of capacitors to be discharged $\Sigma C_{dis}$(nT) and the group of capacitors to be charged $\Sigma C_{ch}$(nT). Equally, as shown in FIG. 2B, the group of parasitic capacitors $\Sigma C_\downarrow$ (nT) at the switching operation for fall in the nth time interval is classified into the group of capacitors to be discharged $\Sigma C_{dis}$(nT) and the group of capacitors to be charged $\Sigma C_{ch}$(nT). In FIGS. 2A and 2B, the capacitor to be discharged is short-circuited by the switching operation, while the capacitor to be charged is connected between the source line and the ground line by the switching operation.

The charge Q(nT) transferred by the charge re-distribution in the nth time interval is then expressed by:

$$Q(nT) = (\Sigma C_\uparrow(nT) + \Sigma C_\downarrow(nT)) \cdot V_{dd} \quad (2).$$

For the charge expressed by the above expression, the charge to be discharged $Q_{dis}$(nT) and the charge to be charged $Q_{ch}$(nT) are expressed by:

$$Q_{dis}(nT) = (\Sigma C_{dis,\uparrow}(nT) + \Sigma C_{dis,\downarrow}(nT)) \cdot V_{dd} \quad (3)$$

$$Q_{ch}(nT) = (\Sigma C_{ch,\uparrow}(nT) + \Sigma C_{ch,\downarrow}(nT)) \cdot V_{dd} \quad (4).$$

While the discharged charge $Q_{dis}$(nT) is substantially eliminated by a short-circuit current at each logic gate, the charged charge $Q_{ch}$(nT) is received from the source and distributed throughout the digital integral circuit for storage. The external source plays a role of feeding $Q_{ch}$(nT) constantly.

As the energy $E_{ch}$(nT) ($=Q_{ch}$(nT)·$V_{dd}$) is consumed at this step, it may not concern how the static energy ($=E_{ch}/2$) accumulated in the digital circuit is distributed at the following discharging step. Even though the group of capacitors $\Sigma C_{ch,\uparrow}$ (nT), $\Sigma C_{ch,\downarrow}$ (nT) to be charged are connected between the source line and the ground line in one time interval (nth time interval) and disconnected from the lines by short-circuiting these capacitors in the succeeding time interval ((n+1)th time interval), role of the external source will not be affected. This process is repeated in every time interval and resultant waveforms of the source current determined through interaction with the parasitic impedances on the source line and the ground line are linearly superimposed. Accordingly, the waveform of the source current during a continuous operation of the digital circuit is obtained. As a result, the effect of the re-distribution of charges throughout the digital circuit is included in the model, hence allowing the waveform of the source current to be analyzed at high fidelity in relation to the transfer of charges in the digital circuit.

In the following description, the group of parasitic capacitors {$\Sigma C_{ch,\uparrow}$ (nT), $\Sigma C_{ch,\downarrow}$ (nT) } is referred to as "a time-division parasitic capacitor series". FIG. 2C illustrates the operation at the nth time interval of the time-division parasitic capacitor series. While the capacitors $\Sigma C_{ch,\uparrow}$ (nT) and $\Sigma C_{ch,\downarrow}$ (nT) are connected to between the source line and the ground line, $\Sigma C_{ch,\uparrow}$((n-1)T) and $\Sigma C_{ch,\downarrow}$((n-1)T) at the (n−1)th time interval are short-circuited. The capacitors at the other time intervals remain short-circuited. The capacitance can be estimated from the known input and output capacitances at the logic gates and the virtual pattern length based on the data of network connection of the digital circuit after the logic synthesis. After a layout is completed, the capacitance can be estimated by considering the parasitic capacitor at each line connecting the logic gates which are extracted from the layout data with higher accuracy.

It is understood that the time interval T (=Δt) used for the time series division is not always identical between the time intervals but may be varied depending on the frequency of occurrence of logic switching operation. For example, the time interval can be varied depending on the frequency of the switching operation. The higher the frequency of occurrence in the time interval, the smaller the time interval T (=Δt) for time division may be assigned continuously. This will shorten the processing time required for the analysis.

The capacitor charged in each time interval is much smaller than a sum of the parasitic capacitors in the digital circuit. Then, the group of parasitic capacitors statically charged is approximated to one capacitor (equivalent to $C_s$ shown in FIG. 2C) which is equivalent to a sum of the parasitic capacitors in the digital circuit. The one capacitor is inserted between the source line and the ground line and is closer to the digital circuit than the parasitic impedance.

(Segmentation)

On a small-scale digital circuit, the parasitic impedances $Z_d$ and $Z_g$ across the source line and the ground line are mainly dependent on impedance components parasitic to off-chip parts including the bonding wires between the LSI chip and an external source, the lead frame of a package, and the wiring of a printed circuit board. Thus only these impedance components may be considered for analysis of the source current on a small-scale digital circuit. On the contrary, a large-scale digital circuit has the long source line and the long ground line, and hence parasitic impedance in its metal wires in the chip have to be considered.

Figure 3A:
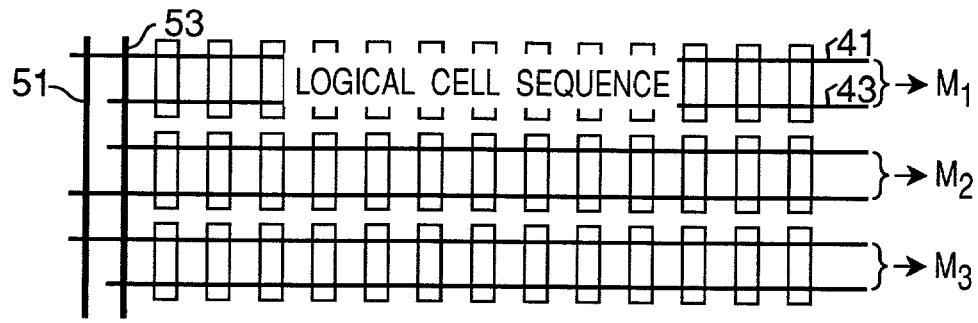
FIG. 3A is a diagram illustrating segmentation.
Figure 3B:
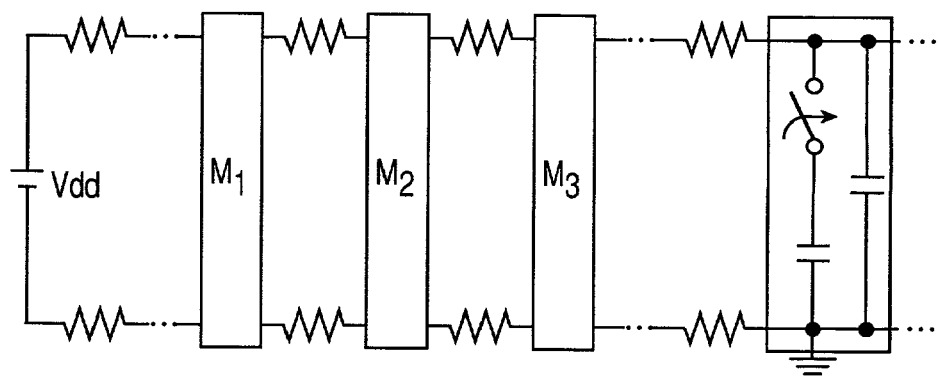
FIG. 3B is a diagram of an equivalent circuit including the parasitic capacitor series separated into segments.

In this embodiment of the present invention, the source line and the ground line in a digital circuit are segmented at a place at which parasitic impedance locally rises, such as joints between a main line and a branch line which are different in a wire width. The time division parasitic capacitor series are calculated from each group of logic gates included in each segment. The segmentation is based on a wiring pattern of the source line and the ground line on the layout. For example as shown in FIG. 3A, when the source line 41 and the ground line 43 of each horizontal logic cell in a typical cell base LSI structure are bundled together with vertical wires 51 and 53, the segments may be defined by $M_1, M_2, \ldots$ as pairs of the source line 41 and the ground line 43 (of each logic cell). The segments $M_1, M_2, \ldots$ are connected to the source $V_{dd}$ as shown in FIG. 3B.

Similarly, the group of parasitic capacitors statically charged in each segment is approximated to one capacitor which is equivalent to a sum of the parasitic capacitor of the digital circuitry in the segment. The one approximated capacitor is inserted between the source line and the ground line and is closer to the digital circuit than the parasitic impedances.

As described above, considering that only the process of charging load capacitance on the switching operation of the logic gates in the digital circuit contributes to the generation of the source current in the large-scale circuit, the model of the source current analysis can be achieved by using the time division parasitic capacitor series by which the large-scale digital circuit is represented with a group of parasitic capacitors connected to be charged in a time series between the source and the ground according to a distribution of the switching operations of the internal logic gates, and a group of parasitic capacitor remaining statically charged. Preferably, the time division parasitic capacitor series are provided in each segment defined by the borders where the parasitic impedance locally rises.

(Improvement of Analysis Accuracy)

The above analysis model fails to account the loss of charge due to direct current short-circuiting between the source line and the ground line provided by the switching operation of each logic gate. When the loss of charge is accounted, the analysis accuracy can further be improved.

On the switching operation, the logic gate generates a source short-circuit and a ground short-circuit in a shorter moment than the switching period ($T_{sw}$). The charge $Q_{sc}$ to be lost (referred to as "a short-circuited charge" hereinafter), in a CMOS inverter circuit, is calculated approximately from:

$$Q_{sc} = \{Beta/(24 \cdot V_{dd})\} \cdot (V_{dd} - 2 \cdot V_{th})^3 \cdot T_{sw} \qquad (5)$$

where $V_{th}$ and Beta are the threshold and the Beta value of an N or P type MOSFET, and $V_{dd}$ is the source voltage.

This process is carried out in parallel with the discharging of a charge $Q_{dis}$ and the charging of a charge $Q_{ch}$ with the switching operation. The short-circuited charge $Q_{sc}$ is received from a closer charge reservoir by the re-distribution of charges.

However, unlike the discharged charge $Q_{dis}$, the external source has to add a charge equivalent to the circuited charge $Q_{sc}$ to $Q_{ch}$ to supply the charge. In this case operation can also be expressed equivalent.

More particularly, as the capacitance $C_{sc}$ calculated from the following equation is added as a correction to the rise or fall capacitance in each gate circuit (See Table 1 of load capacitance), the model of time division parasitic capacitor analysis can incorporate the effect of the short-circuited charge $Q_{sc}$ thus increasing the analysis accuracy.

$$Q_{sc} = C_{sc} \cdot V_{dd} \qquad (6)$$

Generally in the digital circuit, the Beta value of a standard cell is standardized to a reference value or its integral multiple and also, the standard cell is selected so that the switching period $T_{sw}$ remains ideally constant. Accordingly, the capacitor $C_{sc}$ may be a constant.

As the MOSFET is reduced in the size, its switching performance can be improved. This reduces the switching period $T_{sw}$ and lowers the source voltage $V_{dd}$ set for ensuring the operating reliability of the device. The short-circuited charge $Q_{sc}$ is proportional to the first power of switching period $T_{sw}$ and the square of the source voltage $V_{dd}$. Hence, the error developed by the short-circuited charge $Q_{sc}$ in the model of time division parasitic capacitor analysis will be decreased as the MOSFET declined in the size. When this model is used for the analysis of source current in a digital circuit, the short-circuited capacitor may be negligible in the initial approximation.

(Method of Analyzing the Source Current in a Large-scale Digital Circuit)

Figure 4:
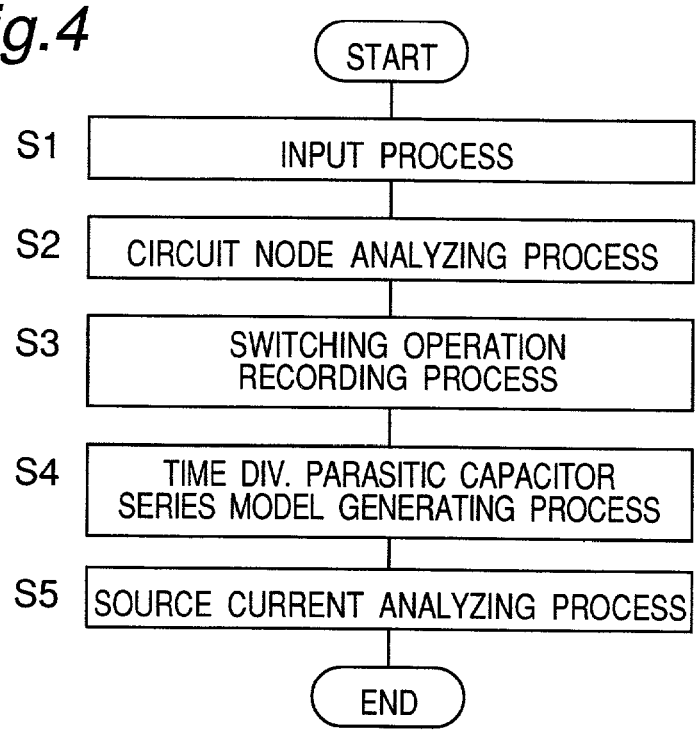
FIG. 4 is a flowchart of the method of analyzing the source current according to the present invention.

A method of analyzing the source current in a large-scale digital circuit with the use of the above described model will now be described. FIG. 4 is a flowchart showing the method of analyzing the waveform of the source current. The method comprises five primary steps S1 to S5.

The input process S1 generates a net list at the gate level of a hardware description language (e.g. Verilog HDL) or a net list at the transistor level of a circuitry description language (e.g. SPICE) for the digital circuit to be subjected to the analysis of the source current. Also, a test vector is produced in which input signals are described for actuating the digital circuit to be analyzed. To make segmentation by the source line 41 and the ground line 43 as shown in FIG. 3, names of the source node and the ground node are assigned to each segment, and the connection between the logic gate or circuit element and the segment is explicitly provided to the net list. If no segmentation is made, the connection between the logic gate or circuit element and the segment may not be included in the net list. Also, for an analysis reflecting accurately a delay of the operation of the logic gate in the digital circuit, the net list can preferably include signal line delay model extracted from the layout pattern or information about elements parasitic to signal lines.

The circuit node connection analyzing process S2 analyzes the net list for the digital circuit to be analyzed to generate a table of the load capacitances for the digital circuit. The load capacitance table denoted by Table 1 illustrates the relationship between the load capacitances in the rise transition at the output node of each logic gate in the digital circuit to be analyzed, the load capacitance in the fall transition at the same, and the segment in which the logic gate is included. Specifically, the process S2 extracts from the net list the output node of the logic gate provided in the digital circuit to be analyzed, and then determines the respective load capacitances $C_{ch\uparrow}$ and $C_{ch\downarrow}$ to be charged at the rise and fall switching operations of the logic gate in relation to each extracted output node. The load capacitance can be determined by calculating the capacitance to be charged at the rise and fall switching operations from the output capacitance, the input capacitance of the succeeding logic gate group and the capacitance of the wiring which have been extracted.

TABLE 1

Load Capacitance Table

| Output node | Segment attribute | Rise charged load capacitance | Fall charged load capacitance |
|---|---|---|---|
| $N_1$ | $M_1$ | $C_{ch\uparrow,1}$ | $C_{ch\downarrow,1}$ |
| $N_2$ | $M_3$ | $C_{ch\uparrow,2}$ | $C_{ch\downarrow,2}$ |
| $N_3$ | $M_1$ | $C_{ch\uparrow,3}$ | $C_{ch\downarrow,3}$ |
| $N_4$ | $M_2$ | $C_{ch\uparrow,4}$ | $C_{ch\downarrow,4}$ |
| ... | ... | ... | ... |
| $N_n$ | $M_x$ | $C_{ch\uparrow,n}$ | $C_{ch\downarrow,n}$ |

The switching operation recording process S3 analyzes and records in a time domain the switching operation on the output node of each logic gate in the digital circuit to be analyzed with the test vector for analyzing. Specifically, it is analyzed how the switching operation on the output node of each logic gate in the digital circuit to be analyzed transits in a time interval (Ty) in relation to the test vector. For the purpose, the process simulates the operation in the time domain with the test vector in the digital circuit to be analyzed using a time domain simulator operable to description type of the net list, and then records the switching time and the switching direction of the output node. The switching direction indicates whether the switching operation is on the rise transition or the fall transition. More particularly, it is analyzed or recorded whether each of the output nodes $N_1$, $N_2$, ... is on the rise transition or the fall transition, or each of the output nodes remains unchanged in the time interval in relation to the test vector as shown in Table 2 before recording the result.

TABLE 2

Switching Operation Record

| | Time interval | | | | |
|---|---|---|---|---|---|
| Output node | $T_1$ | $T_2$ | $T_3$ | ... | $T_m$ |
| $N_1$ | ↓ | ↑ | ↓ | ... | ↓ |
| $N_2$ | ↑ | ↑ | ↓ | ... | ↑ |
| $N_3$ | ↓ | ↓ | ↑ | ... | ↑ |
| $N_4$ | — | ↑ | ↓ | ... | ↓ |
| ... | ↑ | — | ↑ | ... | — |
| $N_n$ | — | — | — | ... | ↑ |

(↑ ... rise transition, ↓ ... fall transition, — ... no change)

The time division parasitic capacitor series model generating process S4 calculates a sum of the load capacitances to be charged in each segment and each time interval divided on the time basis at each of the switching operations recorded in the switching operation recording process S3. More specifically, the table of time division parasitic capacitors for each segment is compiled, as shown in Table 3, where the sum $C_{xy}$ of the load capacitances to be charged (x: the segment, y: the time interval) is listed in each time interval. It is noted that in Table 3 i and j point out the charged parasitic capacitors of the rise and fall switching nodes, respectively, in the segment $M_x$ and the time interval $T_y$. The table of time division parasitic capacitors is prepared for each test vector throughout one digital circuit to be analyzed.

TABLE 3

Time Division Parasitic Capacitor Series Table

| Time→ Segment | ← Δt → $T_1$ | ← Δt → $T_2$ | $T_3$ | ... | $T_m$ |
|---|---|---|---|---|---|
| $M_1$ | $C_{11}$ | $C_{12}$ | $C_{13}$ | ... | $C_{1m}$ |
| $M_2$ | $C_{21}$ | $C_{22}$ | $C_{23}$ | ... | $C_{2m}$ |
| $M_3$ | $C_{31}$ | $C_{32}$ | $C_{33}$ | ... | $C_{3m}$ |
| $M_4$ | $C_{41}$ | $C_{42}$ | $C_{43}$ | ... | $C_{4m}$ |
| ... | ... | ... | ... | ... | ... |
| $M_n$ | $C_{n1}$ | $C_{n2}$ | $C_{n3}$ | ... | $C_{nm}$ |

($C_{xy} = \Sigma C_{ch\uparrow,i} + \Sigma C_{ch\downarrow,j}$)

In the time division parasitic capacitor series table, the sum of load capacitances $C_{xy}$ of one segment $M_x$ and in one time interval $T_y$ is calculated as the following. First, all the output nodes in the segment $M_x$ are specified from the load capacitance table (Table 1). Referring to the switching operation record (Table 2), for each specified node, the operation state (rise/fall/no change) in the time interval $T_y$ is determined. Then, for each output node, the load capacitance $C_{ch\uparrow,i}$ or $C_{ch\downarrow,j}$ to be charged is determined according to the operation state with reference to the load capacitance table (Table 1). The load capacitances to be charged which are thus determined according to the operation state of the output nodes are then summed to provide total capacitance $C_{xy}$.

Then, a net list of time division parasitic capacitor series which is sub-circuited for each segment $M_i$ (i=1, 2, ...) divided by each source line and each ground line is generated in a circuit description language. Each capacitor in the time division parasitic capacitor series in the net list is described together with the switching elements, as shown in FIG. 2C. The switching element operates on the time basis so that a capacitor with which the switch is inserted between the source and the ground to charge the capacitor in a time interval (i), and then the capacitor is discharged locally in the next time interval (i+1).

For the net list generated above, the source current analyzing process S5 adds appropriate wiring impedance between the digital circuit and the external voltage source, and if necessary in the segments for the net list of the capacitor series. Afterward the process S5 analyzes the waveform of the source current in the net list using a transition analysis function of a circuit simulator.

As explained, the method of analyzing the source current describes the large-scale digital circuit as a series of capacitors each of which is charged on each time interval on the time basis, in the time division parasitic capacitor series model. Thus, it is possible to provide a simulation method capable of analyzing at high speed and high accuracy the waveform of the source current considering the process of re-distribution of charges throughout the digital circuit. For generating the model of the time division parasitic capacitor series, it is essential to execute once an operation simulation at a high accuracy in time domain with each test vector for the digital circuit including some hundred thousands to millions of the logic gates. This simulation may take a considerable length of time to be carried out. However, once produced, the model can be used for analyzing. That is, only one particular capacitor may be simulated in each time interval thus speeding up the simulation. Accordingly, in designing which needs the source current simulation to be repeated under different conditions, the following estimations can be performed efficiently, such as estimation of the effect of impedances in the source and ground lines over the source current waveform, optimum structural designing of the de-coupling circuit for attenuating noises, and estimation of the emission of electromagnetic waves.

<Apparatus for Analyzing Source Current in LSI>

Figure 5:
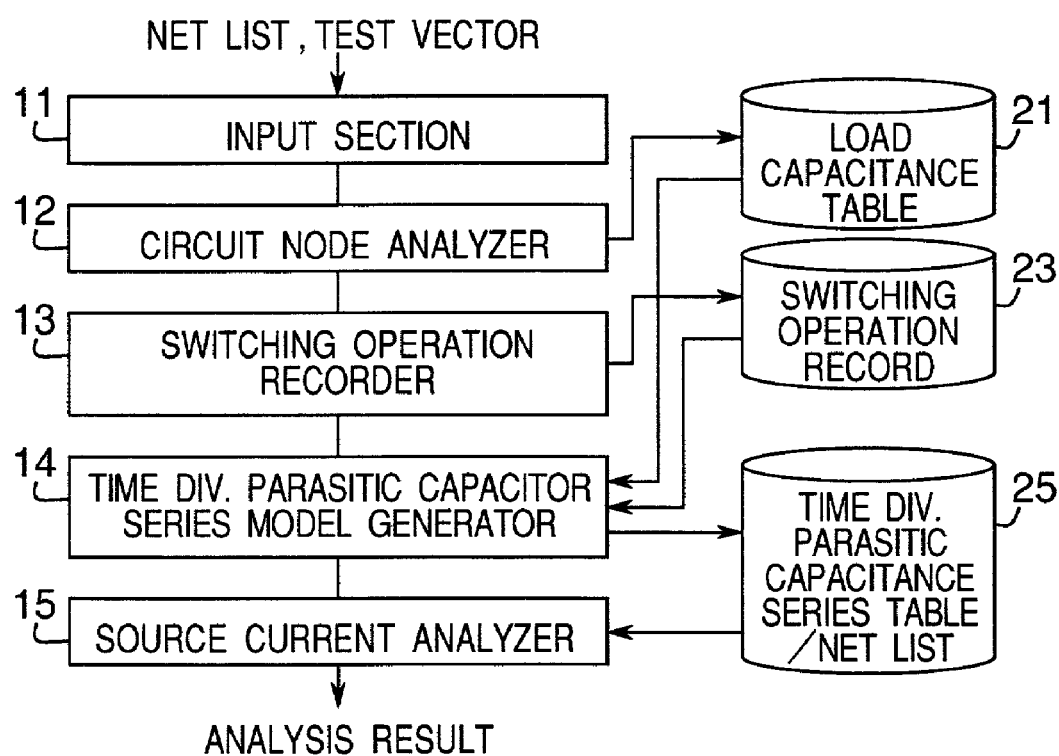
FIG. 5 is a functional block diagram of a source current analyzing apparatus according to the present invention.

FIG. 5 is a block diagram of a source current analyzing apparatus implementing the method of analyzing the waveform of the source current. Five function blocks 11 to 15 in the apparatus correspond to the five steps of the above described method, respectively. The functions of the apparatus may be implemented by a computer system with a CPU executing relevant programs.

The input section 11 inputs a net list on the gate level in a hardware description language or a net list on the transistor level in a circuitry description language, each related to the digital circuit to be subjected to the analysis of the source current. Also, The input section 11 inputs a test vector which describes input signals for actuating the digital circuit to be analyzed. To segment the source line and the ground line as shown in FIG. 3, Names are assigned to each source node and each ground node in each segment, the connection relation between the logic gate or circuit element and the segment is explicitly provided to the net list. It is noted that if no segmentation is involved, the connection between the logic gate or circuit element and the segment may not be provided to the net list. Also, for considering a delay of the operation at the logic gate in the digital circuit during the analysis, data about signal line delay model extracted from the layout or information of signal lines parasitic elements can preferably be included in the net list.

The circuit node connection analyzer 12 analyzes the net list for the digital circuit to be analyzed thus to generate the load capacitance table (See Table 1) for the digital circuit. The load capacitance table is stored in a recording means 21.

The switching operation recorder 13 analyzes and records in a time domain the switching operation in (or on) the output node of each logic gate in the digital circuit to be analyzed for the test vector. More specifically, it is analyzed how the switching operation in (or on) the output node of each logic gate in the digital circuit proceeds in a time interval in relation to the test vector. For the purpose, using the test vector, the switching operation recorder 13 makes a simulation to analyze in the time domain an operation of the digital circuit to be analyzed, and records the switching time and the switching direction of the output node as the switching operation record (See Table 2) in the recording means 23.

The time division parasitic capacitor series model generator 14 classifies the switching operation in each segment and each time interval on the time basis with reference to the switching operation recording, and then calculates a sum of the load capacitances to be charged in each segment and each time interval, thereby generating a time division parasitic capacitor series table (See Table 3). Then, a net list of time division parasitic capacitors which is sub-circuited by each segment divided by each source line and each ground line is generated in the circuitry description language. The net list is recorded to the recording means 25.

The source current analyzer 15 adds a capacitor being statically charged and an appropriate line impedance between the digital circuit and the external source, and if necessary between the segments in the net list of time division parasitic capacitors. The source current analyzer 15 includes a simulator for transition analysis, such as a circuit simulator, for analyzing the waveform of the source current in the net list developed by the transition analysis.

<Examples of Source Current Analyzing Method>

Some exemplary applications of the source current analyzing method will now be provided below.

(Application 1: Analysis of Substrate Noise)

Using the source current analyzing method, the waveform of a substrate noise generated by a shift register as a common digital circuit was analyzed. The analysis of substrate noise is performed using the above described source current analyzing method, regarding a change in voltage caused by the source current as the substrate noise in the semiconductor integrated circuit, where the change in voltage is caused by the source current which flows, according to the operation of the shift register, through a linear resistor (1 ohm) inserted between the source line and the ground line.

A test circuit has ten blocks, each comprising a couple of eight-bit shift registers, connected to the same input for parallel operation. The eight-bit shift register comprises eight common D-type flip flops (DFF) each of which is connected in serial, included in a standard cell library, and designed by a 0.6 μm CMOS technology. The test circuit includes 10,000 elements as a total. For the test circuit, with the device parameters for 0.6 μm CMOS technology (P type substrate-N type single well structure), simulation is done based on the circuit net list described at the full transistor level. During the simulation, the charged capacitance for each time interval at T=250 ps and T=10 ps are extracted, and generates the time division parasitic capacitor series. The capacitor to be charged in each block is much smaller than the parasitic capacitor generated between the source line and the ground line throughout the test circuit. Accordingly, a sum of the parasitic capacitors between the source line and the ground line is expressed as the static capacitor $C_s$ serving as a charge reservoir.

FIGS. 6A to 6C illustrate the result of the analysis in case that the parasitic impedances on the source and ground lines is regarded as serial resistance $R_p=1$. The waveform of the substrate noise thus represents the source current. FIG. 6A is provided for a net list described in full transistor level (conventional method), FIG. 6B is provided for a model with T=10 ps (the present invention), and FIG. 6C is provided is for a model with T=250 ps (the present invention). Three different waveforms of the substrate noise are illustrated at the upper, center and lower parts for three different inputs of the shift register as 00000000, 00110011, and 01010101, respectively. The result of the analysis from the net list described in full transistor level is deemed as a reference waveform. While degrees of the activation in the circuit are different for the three input patterns, the waveform in each model is similar to that of FIG. 6A. It is hence apparent that the source current is accurately analyzed from the models. Regarding with CPU time required for analyzing a period of 200 ns, a case of FIG. 6A shows 2500 seconds as required time, both cases of FIGS. 6B and 6C show a required time smaller than 10 seconds, which means 250 or more times faster than that of FIG. 6A.

A test chip including the test circuit and the substrate noise detector circuit was fabricated by the 0.6 μm CMOS technology. FIGS. 7A and 7B illustrate the waveform of actual substrate noises when the test circuit is activated by the same manner as of generating the time division parasitic capacitor series. FIGS. 8A and 8B show the simulated waveform of substrate noises with the parasitic impedances on the source line and the ground line including a serial inductance $L_p=10$ nH and a resistance Rp=1 ohm, using the time division parasitic capacitor model with T=250 ps. In the figure also shown are the respective waveform of substrate noises generated when the state of activation modifies according to different numbers of the paired shift resistors. Both of the actual waveform and the simulated waveform shown in FIGS. 7A to 7B and 8A to 8B are very similar to each other. As clearly apparent, the two waveform are quantitatively identical in the frequency components and the relative amplitude. It is apparent that this model can represent a generation of the substrate noise accurately. It is noted that a difference in the absolute value of the amplitude between the two waveforms may be derived from the fact that the actual waveform contains an effect of attenuation generated when the substrate noise propagates from a point of generation to a detector circuit. This can be achieved easily by analysis using a combination of this model and a resistance mesh model of the substrate, and the operation of quantitative estimation may be feasible.

The P type substrate on which the test circuit is formed is connected by low impedance to the ground line. Therefore in this application, the analysis is performed assuming that the major cause of the generation of substrate noises is a leak of a voltage change on the ground line into the substrate. The result of the analysis indicates that the substrate noises can be simulated at an enough high accuracy with the method of analyzing the substrate noise. However, with regard to the discharged current of the parasitic capacitor which is negligible in the source current analyzing method with the time division parasitic capacitor series model, the short-circuited path of the discharged current may include a part of the substrate. Handling separately a change in the substrate potential according to the discharged current allows local components of the substrate noise to be analyzed at higher accuracy.

(Application 2: Design Optimization for Low Noise Logic Circuit)

The analyzing method of the present invention is applicable to the analysis of the source current waveform and the substrate noise in a low switching noise logic circuit such as depicted in Japanese Patent No.2997241 and U.S. Pat. No. 6,144,217, and is also applicable to the optimization of low noise designing. In the low switching noise logic circuit of the patent, a static capacitor is added to at least one of the source terminal or the ground terminal of a CMOS circuit in the digital circuit. A resistance (extra resistance) is inserted between a terminal connected to the static capacitor (extra capacitor) and a power supply. Thus, the noise of peak current is attenuated by slowing down the charging and discharging operation of a sum of the parasitic capacitors in a logic sub-block.

More specifically, this analysis method generates the model of the time division parasitic capacitor series for each digital sub-block region (configured by the CMOS logic circuit) separated by the extra resistance using the above described analyzing method, and makes a circuit simulation to a circuit comprising the extra capacitor, the extra resistance and the model to analyze a source current across the extra resistance. Also, the source current of the whole digital block is provided by a sum of the source currents in the sub blocks. The substrate noise is then estimated by analyzing a change in the potential caused by the sum of the source currents flowing across the line impedance of the source and ground lines. The division of blocks can be optimized from the source current amount flowing across each sub block and the amount of the substrate noise generated in the block.

(Application 3: Analysis of Electromagnetic Noise)

In an advanced VLSI technology having an increased scale and a higher speed operation, a change in the source current is relatively large. Thus a fluctuation in electromagnetic field could affect peripheral devices and cause to operate in error. A loop line formed on the VLSI for the source current acts as an antenna. A fluctuation of the source current flowing through the loop line as an antenna allows an electromagnetic wave noise to be emitted. It is generally known that the intensity of such electromagnetic wave noise is proportional to the first or higher power of a change with time of the current (dI/dt). Accordingly, the estimation of such electromagnetic wave noise depends essentially on the estimation of the waveform of the source current. The above described analyzing method of the present invention permits the waveform of the current in the LSI circuit to be analyzed at higher accuracy and is thus applicable to the estimation of the electromagnetic wave noise.

(Application 4: Optimization of Anti-noise Designing in AD Hybrid LSI)

Figure 10:
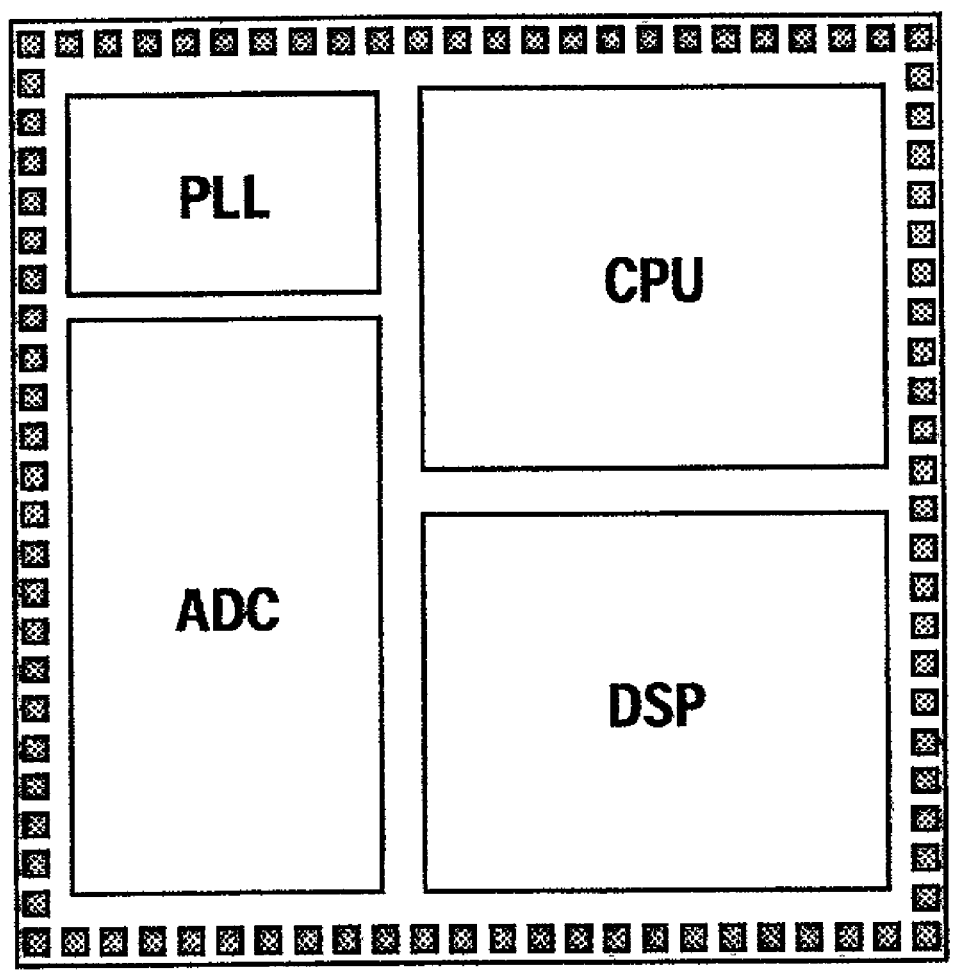
FIG. 10 is a diagram showing an example of AD hybrid LSI.

FIG. 10 illustrates a layout block which has an analog circuit and a digital circuit designed separately and integrated together on a single chip in an AD mixed LSI. Performance of each circuit guaranteed at design may be declined by effect of noises generated when the circuits are activated. It is hence desired to provide a method of estimating the actual performance of each circuit on the AD hybrid chip and reducing the effect of noises so that the actual chip performance meets the designed specification. The method of reducing the effect of noises includes, for example, isolation of source/ground lines between digital and analog circuits, implementation of the de-coupling circuit, insertion of a guard band between the circuits, separation of the operation timing of the circuit on the time basis, anti-noise designing for analog circuits, reduced switching noise design of digital circuits, and so on. It is essential for designing a low noise characteristic of the AD hybrid LSI to optimize the circuit using the above methods while carrying out the substrate noise analysis.

A flow of reduced noise design of an AD mixed LSI using the method of substrate noise analysis according to the present invention will be described in more detail referring to FIG. 9.

Before stating the description of the flowchart of FIG. 9, a library to be referred in the designing of analog and digital circuits is explained. In common, the designing of the AD hybrid LSI employs a library storing data about analog circuits designed before and another library storing data about digital circuits designed before. Particularly, the library for the digital circuits is registered with designing data including a hardware description model (net list) at the gate level or the behavioral or RTL levels as circuit information, the layout data, the test vector, and so on. In this application, for use of the substrate noise analyzing method, in addition to the foregoing data, the model of the time division parasitic capacitor series for the test vector of each function of the digital circuit is generated and stored to the library.

Referring to FIG. 9, the procedure starts with acquisition of the design specification for AD hybrid LSI (S21).

The analog and digital circuits are designed as conforming to the design specification (S22). In the circuitry design, the analog and digital circuits which conform to the design specification are selected from the library. The analog circuit may be implemented by partially or entirely modifying a circuit selected from the library, or by designing a new circuit which conform to the specification and are registered to the library after designing. The digital circuit may be implemented by using a digital circuit selected from the library or designing new circuit which is registered to the library after designing. When newly designed for satisfying the design specification, the designed circuit is first registered to the library and then selected. Particularly, in case that the digital circuit is newly designed, on verification stage for operation of each function at the gate level in the designing process of the digital circuit, a time division parasitic capacitor series for the several kinds of test vectors is generated and then is registered to the library.

Then, the designed analog and digital circuits are disposed and wired as a block on the layout of a single chip (S23). Simultaneously, the above described method of reducing noise is implemented. After the circuits are disposed and wired, a sum of the parasitic capacitors of each block and parasitic impedances on the source line and the ground line are extracted from the layout. Also, the parasitic impedance on a package of a chip or a printed circuit board on which a chip is mounted is estimated. Then, an equivalent chip circuit of the LSI is generated. The equivalent chip circuit comprises one equivalent circuit representing the layout structure of the chip surface which includes locations of circuits and guard bands, the source line, the ground line, the wells and the substrate contacts, and another equivalent circuit of the semiconductor substrate on which these components are mounted.

Then, the functions and the performance of the entire chip are examined. For the purpose, the operation of the entire chip is analyzed (S24). This may be implemented by a conventional method of using the analog/digital hybrid simulation to analyze digital circuits described in the hardware description and the analog circuit including circuit description and hardware description. Also, the substrate noise analysis throughout the entire chip is carried out to examine the substrate noise reaching each circuit, while the noise reduction method is implemented and optimized (the substrate noise being analyzed with the model of the time division parasitic capacitor series stored in the library using the above manner). The digital circuit is replaced by the model of the time division parasitic capacitor series. Then a static capacitance equal to a sum of the parasitic capacitance of each block obtained before is connected with the parasitic impedances on the source line and the ground line to act as a noise source.

Accordingly, the analog circuit, the noise source, and the equivalent chip circuit are analyzed to estimate the degradation of the performance of the analog circuit caused by the substrate noise. Reflecting the result to analysis of the operation of the entire chip structure, the performance of the chip can successfully be estimated.

From the result of the analysis, it is judged whether or not the functions and performance of the chip conform to the design specification (S25). If the functions and performance do not conform to the design specification, the procedure returns back to the circuit designing step (S22) where the analog and digital circuits are reviewed so that the estimated effects of substrate noise are reduced to a sufficient level. For example, modification of wiring pattern at the block level and insertion of the guard band between the blocks is carried out, or the design of the analog circuit blocks may be modified for increasing tolerance against noise. The above steps (S22 to S25) are repeated until the performance of the chip structure conforms to the design specifications. When the design specification are satisfied, the procedure is terminated and moves to the steps of the succeeding stage.

As set forth above, the model of the time division parasitic capacitor series is registered as one of the design data together with the circuit data such as the net list or the like in the library and allows the substrate noise analysis for the digital circuit in the designing of LSI to be performed at a higher speed and a more accuracy. This will facilitate the optimization of the designing of anti-noise scheme in the designing of AD hybrid LSI.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. A method of analyzing a waveform of a source current in a semiconductor integrated circuit including a digital circuit having a plurality of logic gates, comprising:
representing the digital circuit, according to a distribution of switching operations of the logic gates in the digital circuit, as a time-division group of parasitic capacitors comprising parasitic capacitors each connected between a source line and a ground line to be charged at a specific timing, and a group of parasitic capacitors each charged statically;
generating an analysis model by coupling one end of the time-division group of parasitic capacitors, one end of the group of parasitic capacitors charged statically, and parasitic impedance of the source line, and connecting the other end of the time-division group of parasitic capacitors, the other end of the group of parasitic capacitors charged statically, and parasitic impedance of the ground line; and
determining the waveform of the source current in the digital circuit from the analysis model.

2. The method according to claim 1, wherein the digital circuit is divided into a plurality of segments along a border at which the parasitic impedances of the source line and the ground line are locally increased, the parasitic capacitor series and the group of the parasitic capacitors statically charged are assigned for a group of the logic gates included in each segment.

3. The method according to claim 1, wherein each parasitic capacitor included in the time-division group of parasitic capacitors is determined every predetermined time interval, and wherein a length of the time interval is set according to a frequency of the switching operations of the logic gates in a period of time at which the parasitic capacitors are determined.

4. The method according to claim 3, wherein the length of the time interval is set to be of shorter as the frequency of the switching operations is greater.

5. The method according to claim 1, wherein a capacitance of the parasitic capacitor to be charged at a specific timing is calculated from input and output capacitance of the logic gates in the digital circuit to be analyzed.

6. A method of analyzing a substrate noise comprising:
regarding, as a substrate noise, a change in voltage which is caused by an interaction between the source current in the digital circuit determined from the analysis model and the parasitic impedances of the source line and the ground line; and
using the method of claim 1 with the regarded change in voltage to analyze the substrate noise.

7. A method of designing a semiconductor integrated circuit which includes analog and digital circuits, comprising:
receiving a design specification;
designing the analog and digital circuits according to the design specification;
analyzing a substrate noise generated in the digital circuits using the method of claim 6; and
re-designing the analog and digital circuits or their layout and the location of guard bands by reviewing a result of the substrate noise analysis so that a design specification is satisfied.

8. The method according to claim 1, wherein each capacitor of the time-division group of parasitic capacitors is charged at different times in accordance with a predetermined time interval.

9. An apparatus for analyzing a waveform of a source current in a semiconductor integrated circuit including a digital circuit having a plurality of logic gates, comprising:
arrangement for representing the digital circuit, according to a distribution of switching operations of the logic gates in the digital circuit, as a time-division group of parasitic capacitors comprising parasitic capacitors each connected between a source line and a ground line to be charged at a specific timing, and a group of parasitic capacitors each charged statically;
arrangement for generating an analysis model by coupling one end of the time-division group of parasitic capacitors, one end of the group of parasitic capacitors charged statically, and parasitic impedance of the source line, and connecting the other end of the time-division group of parasitic capacitors, the other end of the group of parasitic capacitors charged statically, and parasitic impedance of the ground line; and
arrangement for determining the waveform of the source current in the digital circuit from the analysis model.

10. The apparatus according to claim 8, wherein where the digital circuit is divided into a plurality of segments along a border at which the parasitic impedances of the source line and the ground line are locally increased, the parasitic capacitor series and the group of the parasitic capacitors statically charged are assigned for a group of the logic gates included in each segment.

11. The apparatus according to claim 9, wherein each parasitic capacitor included in the time-division group of parasitic capacitors is determined every predetermined time interval, and wherein a length of the time interval is set according to a frequency of the switching operations of the logic gates in a period of time at which the parasitic capacitors are determined.

12. The apparatus according to claim 11, wherein the length of the time interval is set to be of shorter as the frequency of the switching operations is greater.

13. The apparatus according to claim 9, wherein a capacitance of the parasitic capacitor to be charged at a specific timing is calculated from input and output capacitance of the logic gates in the digital circuit to be analyzed.

14. The apparatus according to claim 9, wherein each capacitor of the time-division group of parasitic capacitors is charged at different times in accordance with a predetermined time interval.

* * * * *